United States Patent
Zeidler et al.

(10) Patent No.: US 6,556,250 B1
(45) Date of Patent: Apr. 29, 2003

(54) METHOD AND APPARATUS FOR PROVIDING A TIMING SIGNAL WITH HIGH FREQUENCY ACCURACY IN VIDEO EQUIPMENT FOR SUPPORTING AN ON-SCREEN DISPLAY IN THE ABSENCE OF A VIDEO SIGNAL

(75) Inventors: David E. Zeidler, Warrington, PA (US); Robert M. Simons, Landsdale, PA (US); Steven M. Corso, Philadelphia, PA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/370,928

(22) Filed: Aug. 10, 1999

(51) Int. Cl.[7] .............................................. H04N 9/475
(52) U.S. Cl. ....................... 348/512; 348/569; 348/536; 348/537
(58) Field of Search ................................. 348/536, 537, 348/538, 542, 544, 545, 497, 495, 569, 500; 455/70, 71; 327/2, 3, 5, 18, 19, 20, 147, 156, 159

(56) References Cited

U.S. PATENT DOCUMENTS

| | | | |
|---|---|---|---|
| 4,122,488 A | | 10/1978 | Mikado |
| 4,631,588 A | | 12/1986 | Barnes et al. |
| 4,809,068 A | * | 2/1989 | Nagai .......................... 358/148 |
| 5,121,206 A | * | 6/1992 | Shibayama et al. ......... 358/150 |
| 5,335,018 A | * | 8/1994 | Mohlmann et al. .......... 348/536 |
| 5,459,524 A | * | 10/1995 | Cooper ........................ 348/507 |
| 5,473,385 A | * | 12/1995 | Leske .......................... 348/500 |
| 5,502,502 A | * | 3/1996 | Gaskill et al. .............. 348/546 |
| 5,612,981 A | | 3/1997 | Huizer |
| 5,796,392 A | * | 8/1998 | Eglit ........................... 345/213 |
| 5,859,671 A | * | 1/1999 | Kim ............................. 348/537 |
| 5,917,873 A | * | 6/1999 | Shiomoto et al. ........... 375/376 |
| 5,929,711 A | * | 7/1999 | Ito ................................. 331/1 |
| 5,982,239 A | * | 11/1999 | Takahashi et al. ............ 331/11 |
| 6,009,006 A | * | 12/1999 | Fernsler ........................ 363/97 |
| 6,310,660 B1 | * | 10/2001 | Abuali et al. ................ 348/616 |

FOREIGN PATENT DOCUMENTS

EP  0 664 616  7/1995

OTHER PUBLICATIONS

Written Opinion from International Preliminary Examination Authority, dated Aug. 16, 2001.

* cited by examiner

*Primary Examiner*—John Miller
*Assistant Examiner*—Annan Q. Shang
(74) *Attorney, Agent, or Firm*—Steven L. Nichols; Ronald P. Kananen; Rader, Fishman & Grauer PLLC

(57) ABSTRACT

A circuit for providing a sufficiently accurate clock signal for reconstruction of an image from a video signal can function with or without receiving an incoming video signal containing clock data. In this way, a clock signal for supporting an on-screen display can be created in the absence of an incoming video signal. Control data used to control a voltage controlled oscillator generating a clock signal is recorded when the control logic of the oscillator is locked to the timing data in an incoming video signal. In the absence of an incoming video signal, the recorded control data is retrieved and resubmitted to the control logic so that the oscillator can be made to output an appropriate clock signal even in the absence of an input video signal.

44 Claims, 3 Drawing Sheets

METHOD AND APPARATUS FOR PROVIDING A TIMING SIGNAL WITH HIGH FREQUENCY ACCURACY IN VIDEO EQUIPMENT FOR SUPPORTING AN ON-SCREEN DISPLAY IN THE ABSENCE OF A VIDEO SIGNAL

FIELD OF THE INVENTION

The present invention relates to the field of video equipment and visual displays. More particularly, the present invention relates to on-screen displays generated by video equipment, such as set-top terminals and video cassette recorders, in the absence of an incoming video signal.

BACKGROUND OF THE INVENTION

Modern video equipment including televisions, video cassette recorders (VCRs), and set-top terminals provide users with tremendous access to television programming. In particular, cable and satellite television systems may provide access to hundreds of channels of video programming. A set-top terminal is a box of electronic circuitry connected between a user's television and a cable or satellite television system for assisting the user in accessing that system.

As the equipment for providing video programming becomes more complicated and offers more features and flexibility to users, the sophistication and programming required to operate such equipment also increases. In fact, some video equipment, particularly VCRs and set-top terminals, now require substantial computing power to optimally process video and audio signals and provide user features such as timed program recording, premium channel de-scrambling, etc.

To support all these features, such video equipment must be readily programmable by users, i.e. receive user input and instructions. To facilitate the programming of such video equipment as VCRs and set-top terminals, on-screen displays ("OSDs") are commonly used. With an OSD, the equipment being programmed takes temporary control of the television set or monitor to which it is connected in order to display menus, user prompts or echoes of user input to assist the user in properly programming the equipment or accessing equipment features.

In general, to generate a visual display on a display device, such as a television set or monitor, the information for the images to be displayed must be provided as a video signal. This is also true of an on-screen display which is derived from a video signal generated by the video equipment. Conversion of a video signal into a visual image on a display screen requires-the use of a clock signal with a highly accurate frequency. For example, the generation of images on a video display device, e.g., a television set or monitor, may require a clock signal accurate to within 3 to 50 ppm. Some televisions require higher clocking accuracy than others. The first manifestation of an inaccurate clock signal is loss of color, i.e., the displayed image degrades to black and white.

With television signals provided by network broadcasters, or cable or satellite companies, the required clock signal is inherently a part of an analog television signal and is always included as part of a digital television signal. Therefore, when a piece of video equipment takes control of a display device, e.g. a television set, and overrides an incoming video signal to provide an on-screen display, the necessary clock signal with a sufficiently accurate frequency can be derived or borrowed from the incoming video signal.

However, a problem arises when the video equipment needs to provide an on-screen display and no video signal is being received from which to extract a clock signal. This occurs, for example, when the video equipment is connected to a television or monitor on which an OSD can be displayed, but is not connected to a cable or satellite system or to a television antenna, or when the video equipment is connected to a signal source, but is not tuned to and receiving any particular channel carrying a video signal.

When no video signal is provided, video equipment, e.g. a set-top terminal, must generate its own clock signal to support an on-screen display. As noted above, generating a high-quality on-screen display requires a precise clock signal with a highly accurate frequency that is used to construct images from the video signal carrying the information for the on-screen display. Generating such a clock signal can be difficult.

In the past, video equipment with the need to generating a high-accuracy clock signal for supporting an on-screen display has been provided with an internal clock circuit built around a dedicated crystal oscillator. The oscillator is calibrated at the factory to provide a sufficiently accurate clock signal to support an on-screen display. However, the expense associated with the calibration of such oscillators and the tendency of such oscillators to drift out of calibration with age or in response to changing temperatures make this solution less than ideal.

Consequently, a better solution has been developed by General Instrument Corporation of Horsham, Pa. in connection with its set-top terminals. In this solution, a voltage controlled crystal oscillator (VCXO) is used to generate the necessary high-accuracy clock signal. Because the oscillator is voltage-controlled, it requires little or no factory calibration and can be continually controlled to adjust for the effects of initial accuracy, aging or extreme temperatures.

In this arrangement, the control voltage applied to the VCXO is measured and recorded when a video signal is being received and properly displayed. Then, if the video equipment needs to generate a video signal for an on-screen display when no incoming video signal is being received, the recorded voltage value is retrieved from memory, and a corresponding voltage is applied to the VCXO to generate the required clock signal for supporting the on-screen display.

In a specific embodiment, an additional A/D converter (1 bit pwm and comparator) is used to measure the VCXO control voltage when the VCXO is locked to the timing of the incoming video signal. This control voltage is then used to adjust the control voltage of the VXCO to the same value when no video signal is being input to the equipment.

This arrangement, however, requires that the set-top terminal incorporate the electronic means for making a measurement of the voltage on the VCXO during reception and display of an incoming video signal. It would be advantageous if this need to measure a voltage value could be eliminated. Consequently, there is a need in the art for a method and apparatus of providing a circuit that can generate a clock signal with a sufficiently accurate frequency to support an on-screen display without requiring factory calibration, being susceptible to aging or temperature or requiring a previous voltage measurement.

SUMMARY OF THE INVENTION

It is an object of the present invention to meet the above-described needs and others. Specifically, it is an object of the present invention to provide a method and apparatus for controlling a VCXO in the absence of an incoming video signal to produce a clock signal with a sufficiently accurate frequency to support an on-screen display, particularly without requiring a previous voltage measurement.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve these stated and other objects, the present invention may be described as a clock circuit for outputting a clock signal for video reconstruction in the absence of an incoming video signal. The present invention may be embodied in a clock circuit that includes a control logic circuit with a phase locked loop for receiving an incoming video signal and phase locking to the clock signal component within the incoming video signal. The control logic circuit then outputs a control signal based on the phase lock to control the output of a voltage controlled oscillator.

The clock circuit also includes a circuit for recording control data from the control signal during the phase lock. The recorded control data is then used by the clock circuit to control the voltage controlled oscillator in the absence of an incoming video signal. Preferably, the circuit for recording control data includes a processor and a memory unit. The processor may monitor the incoming video signal and automatically provide the recorded control data from the memory unit in the absence of the incoming video signal.

The voltage controlled oscillator outputs a clock signal with a sufficiently accurate frequency to support an on-screen display in the absence of the incoming video signal from which a clock signal can be obtained. A voltage signal generator is preferably used to receive the control signal from the control logic circuit and to drive the voltage controlled oscillator in accordance with that control signal.

The present invention may be applied regardless of whether the incoming video signal is analog or digital. Where the incoming video signal is a digital signal, the phase locked loop locks to program clock reference data in the incoming video signal. Where the incoming video signal is an analog signal, the phase locked loop locks to the horizontal frequency of the incoming video signal.

The present invention also encompasses a corresponding method of producing a clock signal for video reconstruction in the absence of an incoming video signal. The method includes the steps of retrieving previously recorded control data for a voltage controlled oscillator which was output by a control logic circuit with a phase locked loop and recorded when the phase locked loop was locked to a clock signal component within an incoming video signal.

The method further includes the steps of:
(1) recording the control data that is output by the control logic circuit with a phase locked loop when the phase locked loop is locked to a clock signal component within an incoming video signal; and
(2) monitoring the status of the incoming video signal so as to initiate the retrieval of the recorded control data when the incoming video signal is not present.

The present invention further encompasses an embodiment comprising: a voltage controlled oscillator for outputting a clock signal and a control logic circuit for outputting a control signal to control the voltage controlled oscillator. The control logic circuit compares the clock signal with a reference clock signal, when present, and adjusts the control signal in accordance with the comparison. The clock signal is not necessarily the same frequency as the reference clock signal. Moreover, the clock signal being adjusted does not interfere with the display of a video signal using its own clock signal component. The reference clock signal may be taken from an in-band or out-of-band digital data recovered clock.

A recording circuit records the control data of the control signal during the comparison. The recorded control data is then used by the clock circuit to control the voltage controlled oscillator in the absence of an incoming video signal.

Finally, the present invention encompasses a corresponding method of generating a clock signal for video reconstruction in the absence of an incoming video signal. The method includes using stored control data to control a voltage controlled oscillator to output a clock signal, where the stored control data was taken from a control signal output by a control logic circuit while the control logic circuit compared the clock signal from the voltage controlled oscillator with a reference clock signal and output the control signal in accordance with said comparison.

BRIEF DESCRIPTION OF THE DRAWINGS

The accompanying drawings illustrate the present invention and are a part of the specification. Together with the following description, the drawings demonstrate and explain the principles of the present invention.

DETAILED DESCRIPTION OF THE PREFERRED EMBODIMENTS

Using the drawings, the preferred embodiments of the present invention will now be explained. Stated in broad principle, the present invention provides a device and method whereby the control information for controlling a voltage controlled oscillator ("VCXO") to produce a clock signal required for video reconstruction, when locked to the timing of an incoming video signal, is recorded. Then, in the absence of an incoming video signal, the recorded control information is retrieved to control the VCXO to produce the needed clock signal. In this way, a sufficiently accurate clock signal can be provided to support an on-screen display ("OSD") even in the absence of an incoming video signal. The principles of the invention apply regardless of whether the incoming video signal is in digital or analog format.

Figure 1:
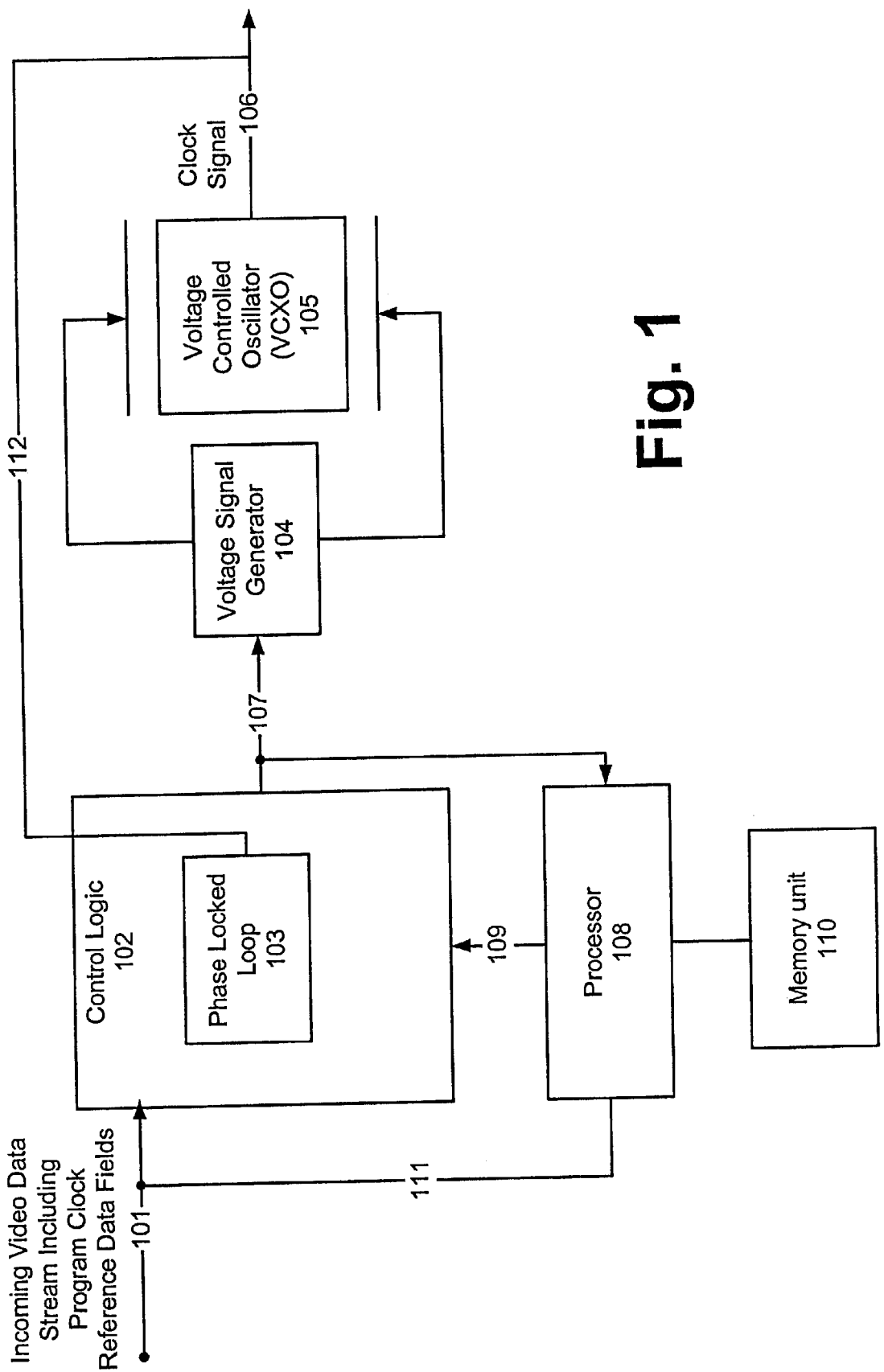
FIG. 1 is a block diagram of an embodiment of a clock signal generator using a digital video signal according to the principles of the present invention.

FIG. 1 illustrates an embodiment of the present invention as a device for generating a clock signal for an on-screen display in a piece of video equipment, such as a set-top terminal, when the incoming video signal (101) is a digital signal. As shown in FIG. 1, the incoming digital video signal (101), i.e. the video data stream, is provided to a control logic circuit (102). The digital video signal (101) includes data fields in which a program clock reference ("PCR") is provided. The PCR is a part of the MPEG-2 (Motion Picture Experts Group) digital signal format and functions as a digital clock signal that is used to reconstruct the images carried in the digital data stream (101) for display on a television set or monitor (not shown).

The control logic circuit (102) using an internal phase locked loop circuit (103) will lock to the PCR data and output a corresponding control signal (107) to a voltage signal generator (104). The voltage signal generator (104) responds to the control signal (107) and controls the voltage controlled oscillator (VCXO) (105) to output a clock signal (106) based on the timing from the PCR. The clock signal (106) is fed back to the phase locked loop circuit (103) on line (112) to complete the loop.

The circuit of FIG. 1, as described thus far, may be dedicated to providing a clock signal for on-screen display only. In which case, the clock signal (106) is not used in the actual reconstruction of the images from the video data stream (101). Rather, another circuit similar or identical to that of FIG. 1, as described thus far, would be provided for generating the clock signal used in the actual reconstruction of the images from the video data stream (101). Alternatively, the VCXO (105) illustrated in FIG. 1 may be used for producing a clock signal (106) which is used for both supporting an on-screen display and for processing the video data stream (101) for actual display.

Under the principles of the present invention, a processor (108) which may be part of, or separate from, the control logic circuit (102) monitors the control signal (107) output to the voltage signal generator (104). When the phase locked loop (103) has locked to the program clock reference (PCR) data in the incoming video stream using the loop, including timing signal (106) carried over line (112), and is outputting a control signal (107) based on that lock, the processor (108) records the control data from the control signal (107). A memory unit (110) may be provided in which the processor (108) stores this information.

When a clock signal (106) is needed and the incoming video data stream (101) is not present, the processor (108) can retrieve the control data from the memory unit (110) and provide the control data (109) to the control logic circuit (102). The control logic circuit (102) then generates a control signal (107) equivalent to that represented by the recorded control data (109) from which the voltage signal generator (104) can control the VCXO (105) to produce an appropriate clock signal.

The processor (108) may also monitor the presence or absence of the incoming data stream (101) over line (111) so as to automatically provide the control data (109) when the incoming data stream (101) is absent. In this way, an appropriate clock signal for an on-screen display can be provided automatically in the absence of an incoming video data stream. Other means of noting the absence of the incoming video signal and initiating retrieval of the control data stored in memory are also within the scope of the present invention.

Figure 2:
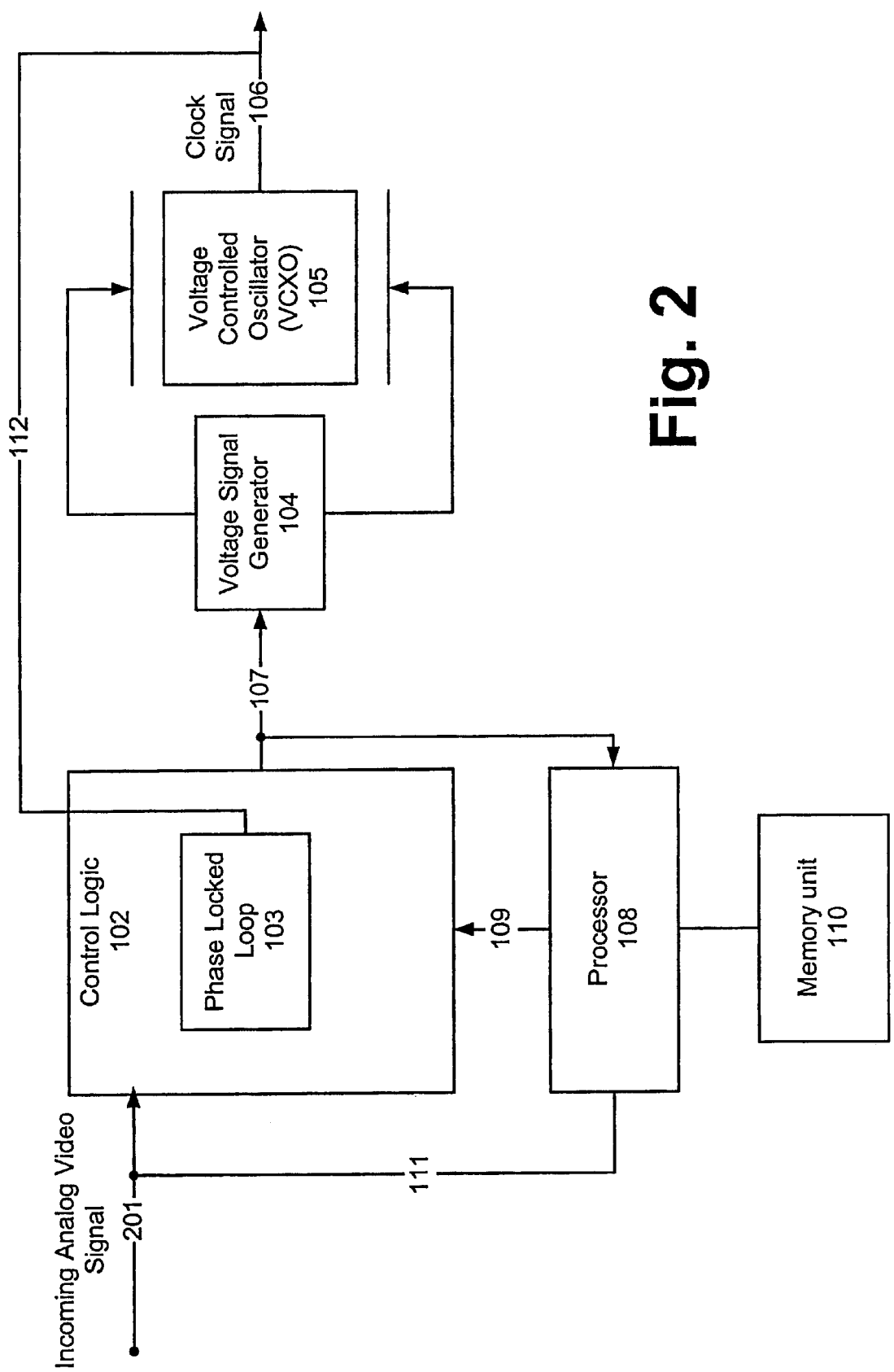
FIG. 2 is a block diagram of a clock signal generator according to the principles of the present invention using an analog video signal input.

The same principles can be applied if the incoming video signal is an analog signal as opposed to a digital bitstream. FIG. 2 illustrates an embodiment of the invention for working with a incoming analog video signal (201). The timing for reconstructing video data from the analog video signal is indicated by the horizontal frequency of the analog video signal. Consequently, the control logic circuit (102) uses its phase locked loop (103, 112) to lock to the horizontal frequency of the analog video signal (201).

Based on this phase lock, the control logic circuit (102) outputs a corresponding control signal (107) which drives the voltage signal generator (104) causing the VXCO (105) to output a clock signal (106) that corresponds to the timing data from the horizontal frequency of the analog video signal (201). As before, this clock signal (106) may or may not be used in the actual reconstruction of video images from the analog video signal (201).

The processor (108) will monitor the control signal (107) and record the control data represented thereby, preferably in the memory unit (110) when the phase locked loop (103) is locked to the horizontal frequency of the incoming analog signal (201). In the absence of the analog signal (201), the processor (108) provides a signal (109) to the control logic conveying the recorded control data so that an equivalent control signal (107) can be generated and output to the voltage signal generator (104). The generator (104) then drives the VCXO to produce an appropriate clock signal for use in supporting an on-screen display even in the absence of an incoming video signal (201).

Figure 3:
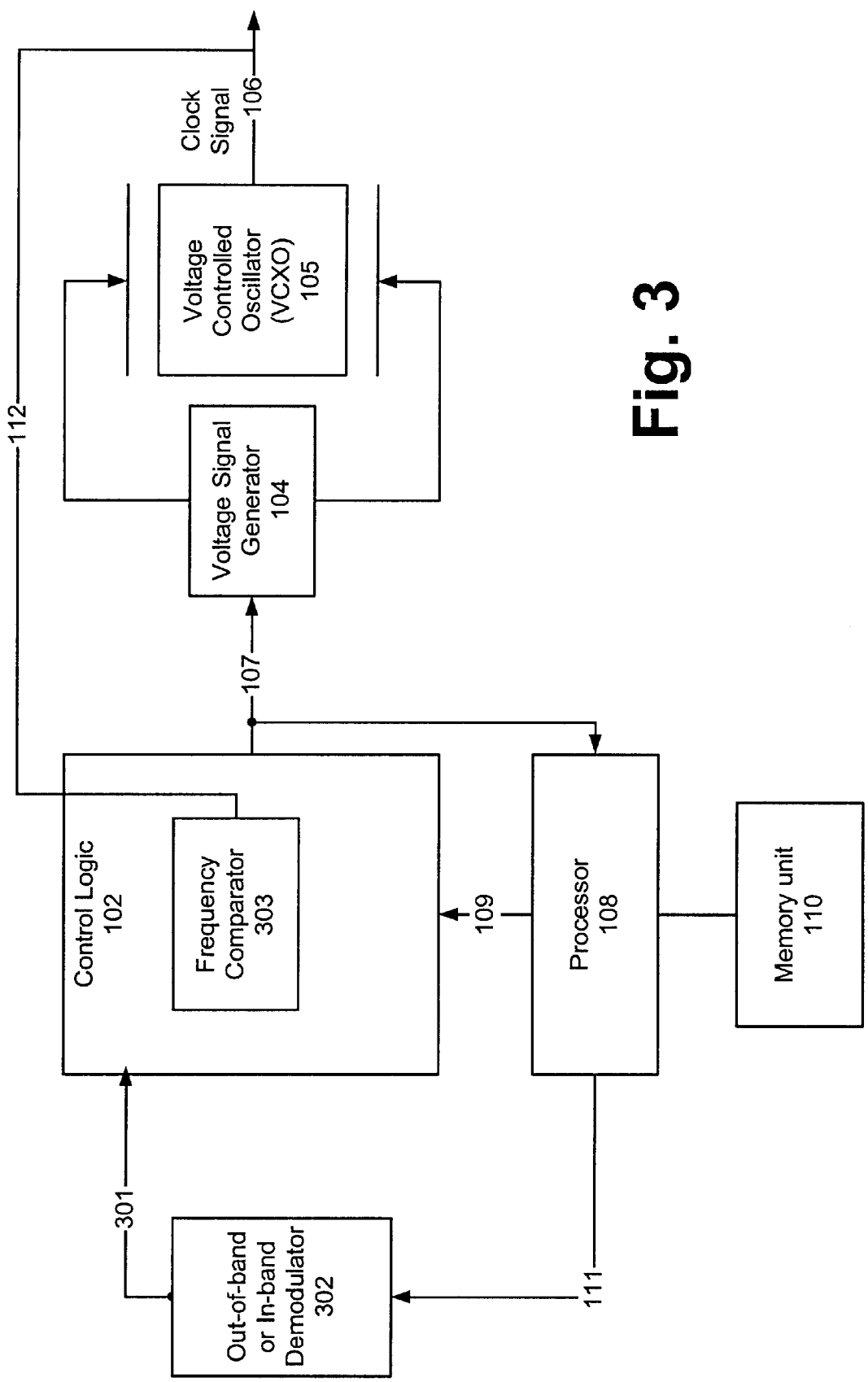
FIG. 3 is a block diagram of third embodiment of the present invention.

There are other reference signals that can be used to ensure the accuracy of the frequency of the clock signal (106) produced by the VCXO (105) in the absence of an incoming video signal. As illustrated in FIG. 3, a demodulator (302) can be used to provide a clock signal (301) based on the out-of-band or in-band digital data recovered clock.

This clock signal (301) does not necessarily or even likely have the frequency needed for a clock signal (106). For example, the out-of-band reference clock signal has a frequency of 2.048 MHz. While the frequency desired for clock signal (106) to support an on-screen display is 27 MHz. However, the reference clock signal (301) can still be used as a basis to generate a control signal (107) that will result in a clock signal (106) with the appropriate frequency. The clock signal (301) is fed to the control logic circuit (102) which outputs the control signal (107) for the voltage signal generator (104) based thereon. The voltage signal generator (105) then outputs a clock signal (106). The processor (108) may ensure the validity of the reference clock signal (301) over line (111) by monitoring the lock status of the demodulator (302).

The clock signal (106) is fed back to a frequency comparator (303) in the control logic circuit (102) over feed back line (112). The frequency comparator (303) will compare the frequency of the resulting clock signal (106) to that of the reference clock signal (301). As noted, clock signal (106) has a different frequency than that of the reference clock signal (301). Therefore, the comparator (303) adjusts for the difference and then compares the accuracy of the clock signal (106) against that of the reference clock signal (301). The control logic (102) will adjust the control signal (107) appropriately if the clock signal (106) is not sufficiently accurate as compared to the reference clock signal (301).

It will be understood by those skill in the art that such adjustments can only be made if the clock signal (106) is not being used to support display of an incoming video signal. An incoming video signal might, however, be displayed based on its own clock signal component while the unused clock signal (106) is being adjusted for eventual use in support of an on-screen display in the absence of an incoming video signal.

When the voltage control oscillator (105) is outputting a stable clock signal (106) which is based on the reference clock signal (301) and achieving sufficient accuracy, the processor (108) will obtain and record the control data from the control signal (107). Again, the memory unit (110) may be used to store this information.

When a clock signal (106) is needed and an input video signal is not present, the processor (108) can retrieve the control data from the memory unit (110) and provide the control data (109) to the control logic circuit (102). The control logic circuit (102) then generates a control signal (107) equivalent to that represented by the recorded control data (109) from which the voltage signal generator (104) can control the VCXO (105) to produce an appropriate clock signal.

The processor (108) may also monitor the presence or absence of an incoming video signal so as to automatically provide the control data (109) when an incoming video signal is absent. In this way, an appropriate clock signal for an on-screen display can be provided automatically in the absence of an incoming video signal.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A clock circuit for outputting a clock signal for video reconstruction in the absence of an incoming video signal comprising:
    a control logic circuit with a phase locked loop circuit for receiving an incoming video signal and phase locking to a clock signal component within said incoming video signal, wherein said control logic circuit outputs a control signal to control an output of a voltage controlled oscillator based on said phase lock; and
    a circuit for recording control data of said control signal during said phase lock;
    wherein said recorded control data is used by said clock circuit to control said voltage controlled oscillator in the absence of an incoming video signal.

2. The clock circuit of claim 1, wherein said circuit for recording control data comprises a processor and a memory unit.

3. The clock circuit of claim 2, wherein said processor monitors said incoming video signal and provides said recorded control data from said memory unit in the absence of said incoming video signal.

4. The clock circuit of claim 1, wherein said voltage controlled oscillator outputs a clock signal with a sufficiently accurate frequency to support an on-screen display in the absence of said incoming video signal.

5. The clock circuit of claim 1, wherein said incoming video signal is a digital signal and said phase locked loop locks to program clock reference data in said incoming video signal.

6. The clock circuit of claim 1, wherein said incoming video signal is an analog signal and said phase locked loop locks to a horizontal frequency of said incoming video signal.

7. The clock circuit of claim 1, further comprising a voltage signal generator which receives said control signal of said control logic circuit and drives said voltage controlled oscillator in accordance with said control signal.

8. A method of producing a clock signal for video reconstruction and an on-screen display in the absence of an incoming video signal, the method comprising:
    retrieving previously recorded control data for a voltage controlled oscillator which was output by a control logic circuit with a phase locked loop and recorded when said phase locked loop was locked to a clock signal component within an incoming video signal;
    outputting said control data to said voltage controlled oscillator to generate a clock signal for video reconstruction; and
    providing an on-screen display using said clock signal in the absence of an incoming video signal.

9. The method of claim 8, further comprising recording said control data that is output by said control logic circuit with a phase locked loop when said phase locked loop is locked to a clock signal component within an incoming video signal.

10. The method of claim 8, further comprising monitoring a status of said incoming video signal so as to initiate said retrieving when said incoming video signal is not present.

11. The method of claim 9, wherein said incoming video signal is a digital signal and said phase locked loop locks to program clock reference data in said incoming video signal.

12. The method of claim 9, wherein said incoming video signal is an analog signal and said phase locked loop locks to a horizontal frequency of said incoming video signal.

13. A system for generating an on-screen display in the absence of an incoming video signal comprising:
    means for receiving an incoming video signal and phase locking to a clock signal component within said incoming video signal, wherein said means for receiving an incoming video signal outputs a control signal based on said phase lock to control an output of a means for generating a clock signal; and
    means for recording control data of said control signal during said phase lock;
    wherein said recorded control data is used to control said means for generating a clock signal in the absence of an incoming video signal; and
    means for generating an on-screen display based on said clock signal.

14. The means of claim 13, wherein said means for recording control data comprises a processor and a memory unit.

15. The means of claim 14, wherein said processor monitors said incoming video signal and provides said recorded control data from said memory unit in the absence of said incoming video signal.

16. The means of claim 13, wherein said means for generating a clock signal comprises a voltage controlled oscillator that outputs a clock signal with a sufficiently accurate frequency to support an on-screen display in the absence of said incoming video signal.

17. The means of claim 13, wherein said incoming video signal is a digital signal and said means for phase locking locks to program clock reference data in said incoming video signal.

18. The means of claim 13, wherein said incoming video signal is an analog signal and said means for phase locking locks to a horizontal frequency of said incoming video signal.

19. The means of claim 16, wherein said means for generating a clock signal further comprises a voltage signal generator which receives said control signal and drives said voltage controlled oscillator in accordance with said control signal.

20. A clock circuit for outputting a clock signal for video reconstruction in the absence of an incoming video signal comprising:
    a voltage controlled oscillator for outputting a clock signal;
    a control logic circuit for outputting a control signal to control said voltage controlled oscillator, wherein said control logic circuit compares said clock signal with a reference clock signal and adjusts said control signal in accordance with said comparison; and a circuit for recording control data of said control signal during said comparison;

wherein said recorded control data is used by said clock circuit to control said voltage controlled oscillator to generate an on-screen display in the absence of said incoming video signal.

21. The clock circuit of claim 20, wherein a processor monitors said incoming video signal and provides said recorded control data from a memory unit in the absence of said incoming video signal.

22. The clock circuit of claim 20, wherein said reference clock signal is output by an out-of-band demodulator in accordance with an out-of-band digital data recovered clock.

23. The clock circuit of claim 20, wherein said reference clock signal is output by an in-band demodulator in accordance with an in-band digital data recovered clock.

24. The clock circuit of claim 21, wherein said reference clock signal has a different frequency than said clock signal.

25. A method of generating a clock signal for video reconstruction in the absence of an incoming video signal, the method comprising using stored control data used to control a voltage controlled oscillator to output a clock signal, wherein said stored control data was taken from a control signal output by a control logic circuit while said control logic circuit compared said clock signal from said voltage controlled oscillator with a reference clock signal and output said control signal in accordance with said comparison said method further comprising monitoring said incoming video signal and providing said recorded control data to said logic circuit in the absence of said incoming video signal.

26. The method of claim 25, generating said reference clock signal with an out-of-band demodulator in accordance with an out-of-band digital data recovered clock.

27. The method of claim 25, generating said reference clock signal with an in-band demodulator in accordance with an in-band digital data recovered clock.

28. A clock circuit for outputting a clock signal for video reconstruction in the absence of an incoming video signal comprising:

a control logic circuit with a phase locked loop circuit for receiving an incoming video signal and phase locking to a clock signal component within said incoming video signal, wherein said control logic circuit outputs a control signal to control an output of a voltage controlled oscillator based on said phase lock; and a circuit for recording control data of said control signal during said phase lock and for outputting said recorded control data to control said voltage controlled oscillator in the absence of an incoming video signal.

29. A clock circuit for outputting a clock signal for video reconstruction in the absence of an incoming video signal comprising:

a voltage controlled oscillator for outputting a clock signal;

a control logic circuit for outputting a control signal to control said voltage controlled oscillator, wherein said control logic circuit compares said clock signal with a reference clock signal and adjusts said control signal in accordance with said comparison; and a circuit for recording control data of said control signal during said comparison and for outputting said recorded control data to control said voltage controlled oscillator to generate an on-screen display in the absence of said incoming video signal.

30. A clock circuit for outputting a clock signal for video reconstruction in the absence of an incoming video signal comprising:

a control logic circuit for receiving an incoming video signal, said control logic circuit comprising a phase locked loop circuit for phase locking to a clock signal component within said incoming video signal, wherein said control logic circuit outputs a control signal to control a voltage controlled oscillator based on said phase lock; and a circuit for recording control data of said control signal during said phase lock, said circuit for recording control data comprising a processor and a memory unit, wherein said memory unit is not continually refreshed during said phase lock;

wherein said recorded control data is used by said clock circuit to control said voltage controlled oscillator in the absence of an incoming video signal.

31. The clock circuit of claim 30, wherein said processor monitors said incoming video signal and provides said recorded control data from said memory unit in the absence of said incoming video signal.

32. The clock circuit of claim 30, wherein said voltage controlled oscillator outputs a clock signal with a sufficiently accurate frequency to support an on-screen display in the absence of said incoming video signal.

33. The clock circuit of claim 30, wherein said incoming video signal is a digital signal and said phase locked loop locks to program clock reference data in said incoming video signal.

34. The clock circuit of claim 30, further comprising a voltage signal generator which receives said control signal of said control logic circuit and drives said voltage controlled oscillator in accordance with said control signal.

35. A clock circuit for outputting a clock signal for video reconstruction in the absence of an incoming video signal comprising:

a control logic circuit for receiving an incoming video signal, said control logic circuit comprising a phase locked loop circuit for phase locking to a clock signal component within said incoming video signal, wherein said control logic circuit outputs a digital control signal to control a voltage controlled oscillator based on said phase lock; and a circuit for recording control data of said digital control signal during said phase lock, said circuit for recording control data comprising a processor and a digital memory unit;

wherein said recorded control data is used by said clock circuit to control said voltage controlled oscillator in the absence of an incoming video signal.

36. The clock circuit of claim 35, wherein said processor monitors said incoming video signal and provides said recorded control data from said memory unit in the absence of said incoming video signal.

37. The clock circuit of claim 35, wherein said voltage controlled oscillator outputs a clock signal with a sufficiently accurate frequency to support an on-screen display in the absence of said incoming video signal.

38. The clock circuit of claim 35, wherein said incoming video signal is a digital signal and said phase locked loop locks to program clock reference data in said incoming video signal.

39. A method of producing a clock signal for video reconstruction and an on-screen display in the absence of an incoming video signal, the method comprising:

when said incoming video signal is absent, retrieving previously recorded control data for a voltage controlled oscillator which was output by a control logic circuit with a phase locked loop and recorded when said phase locked loop was locked to a clock signal component within an incoming video signal; and when said incoming video signal is absent, outputting said control data to said voltage controlled oscillator to generate a clock signal for video reconstruction.

40. The method of claim 39, further comprising providing an on-screen display using said clock signal in the absence of an incoming video signal.

41. The method of claim 39, further comprising recording said control data that is output by said control logic circuit with a phase locked loop when said phase locked loop is locked to a clock signal component within an incoming video signal.

42. The method of claim 39, further comprising monitoring a status of said incoming video signal so as to initiate said retrieving when said incoming video signal is not present.

43. The method of claim 39, wherein said incoming video signal is a digital signal and said phase locked loop locks to program clock reference data in said incoming video signal.

44. The method of claim 39, wherein said incoming video signal is an analog signal and said phase locked loop locks to a horizontal frequency of said incoming video signal.

\* \* \* \* \*